US012660681B2

(12) United States Patent
Kimijima

(10) Patent No.: US 12,660,681 B2
(45) Date of Patent: Jun. 16, 2026

(54) MODULE-TYPE SEMICONDUCTOR DEVICE AND METHOD OF MANUFACTURING MODULE-TYPE SEMICONDUCTOR DEVICE

(71) Applicant: FUJI ELECTRIC CO., LTD., Kawasaki (JP)

(72) Inventor: Daisuke Kimijima, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 739 days.

(21) Appl. No.: 17/483,323

(22) Filed: Sep. 23, 2021

(65) Prior Publication Data

US 2022/0157673 A1    May 19, 2022

(30) Foreign Application Priority Data

Nov. 19, 2020    (JP) ................................. 2020-192825

(51) Int. Cl.
　　*H10W 76/63*　　(2026.01)
　　*H10W 70/40*　　(2026.01)
　　　　(Continued)

(52) U.S. Cl.
　　CPC ......... *H10W 76/63* (2026.01); *H10W 70/479* (2026.01); *H10W 74/114* (2026.01);
　　　　(Continued)

(58) Field of Classification Search
　　CPC ... H01L 23/10; H01L 23/049; H01L 23/3121; H01L 23/3128; H01L 23/564;
　　　　(Continued)

(56) References Cited

U.S. PATENT DOCUMENTS 5,814,883 A      9/1998 Sawai et al.
10,083,885 B1 *  9/2018 Donofrio ............... H05K 3/284
　　　　(Continued)

FOREIGN PATENT DOCUMENTS

JP      01225192 A  *  9/1989
JP      H08125050 A  *  5/1996
　　　　(Continued)

OTHER PUBLICATIONS

Z-240 product data sheet from DIC Corporation (Year: 2023).*
　　　　(Continued)

*Primary Examiner* — Yu Chen
(74) *Attorney, Agent, or Firm* — Rabin & Berdo, P.C.

(57) ABSTRACT

A semiconductor device includes a substrate having a first main surface on which a semiconductor chip is mounted, a case adhered to a peripheral edge of the substrate to form a recess in which the semiconductor chip is disposed, a cover disposed in the case with a first gap in a direction parallel to the first main surface between the cover and the case such that a second main surface of the cover faces the first main surface, and a first adhesive layer embedded in the first gap. The first adhesive layer has a first protruding portion and/or a second protruding portion, the first and second protruding portions respectively protruding outside and inside the recess from the first gap while being in contact with the inner walls of the case and respectively a third main surface of the cover opposite to the second main surface, and the second main surface.

18 Claims, 5 Drawing Sheets

(51) Int. Cl.

| | |
|---|---|
| *H10W 74/10* | (2026.01) |
| *H10W 76/15* | (2026.01) |
| *H10W 76/47* | (2026.01) |
| *H10W 40/25* | (2026.01) |
| *H10W 90/00* | (2026.01) |

(52) U.S. Cl.
CPC ........... *H10W 76/15* (2026.01); *H10W 76/47* (2026.01); *H10W 40/258* (2026.01); *H10W 90/755* (2026.01)

(58) Field of Classification Search
CPC . H01L 23/24; H01L 23/053; H01L 23/49861; H01L 23/043; H01L 23/045; H01L 23/047; H01L 2924/16196; H01L 2924/16251; H01L 2924/163–16598; H01L 2924/1632; H01L 2924/16195; H10W 76/60; H10W 76/63; H10W 76/67; H10W 76/136; H10W 76/47; H10W 76/40; H10W 70/479
See application file for complete search history.

(56) References Cited

U.S. PATENT DOCUMENTS

| | | | | |
|---|---|---|---|---|
| 2002/0066955 | A1* | 6/2002 | Shibamoto | H01L 23/24 |
| | | | | 257/E23.101 |
| 2007/0284714 | A1* | 12/2007 | Sakakibara | H01L 24/97 |
| | | | | 257/E31.118 |
| 2015/0262972 | A1* | 9/2015 | Katkar | H01L 22/32 |
| | | | | 438/107 |
| 2017/0141022 | A1* | 5/2017 | Maruyama | H01L 23/24 |
| 2019/0109059 | A1 | 4/2019 | Ohara et al. | |
| 2019/0371686 | A1* | 12/2019 | Harada | H01L 23/28 |
| 2020/0091024 | A1* | 3/2020 | Yanaura | H01L 23/24 |
| 2021/0210401 | A1* | 7/2021 | Masumoto | H01L 23/24 |

FOREIGN PATENT DOCUMENTS

| | | | |
|---|---|---|---|
| JP | H09102559 A | | 4/1997 |
| JP | 2005146198 A | * | 6/2005 |
| JP | 2009135164 A | | 6/2009 |
| JP | 2018-195726 A | | 12/2018 |
| JP | 2019071392 A | | 5/2019 |

OTHER PUBLICATIONS

Machine English translation of JP-01225192 (Year: 1989).*
Japanese Office Action dated Jul. 16, 2024, in the counterpart Japanese Patent Application No. 2020-192825.

* cited by examiner

FIG.8

| | REFERENCE EXAMPLE | EMBODIMENT | | | | COMPARISON EXAMPLE | |
|---|---|---|---|---|---|---|---|
| | NO SEALING | FIRST SAMPLE | SECOND SAMPLE | THIRD SAMPLE | FOURTH SAMPLE | FIRST SAMPLE | SECOND SAMPLE |
| SEALING MATERIAL | - | SILICONE | SILICONE | SILICONE | SILICONE | EPOXY RESIN | POLYURETHANE RESIN |
| YOUNG'S MODULUS [MPa] | - | 1 | 20 | 50 | 60 | 2500 | 90 |
| IMPACT TEST | OK | OK | OK | OK | △ | NG | NG |
| HEAT CYCLE TEST | OK | OK | OK | OK | OK | NG | NG |
| CORROSIVE GAS TEST | NG | OK | OK | OK | OK | NG | NG |

| SEALING MATERIAL VISCOSITY [Pa·s] | 120 | 120 | 120 | 300 | 300 | 300 |
|---|---|---|---|---|---|---|
| GAP WIDTH [mm] | 1 | 3 | 5 | 1 | 3 | 5 |
| SHAPE MAINTAINED | OK | OK | △ | OK | OK | △ |

MODULE-TYPE SEMICONDUCTOR DEVICE AND METHOD OF MANUFACTURING MODULE-TYPE SEMICONDUCTOR DEVICE

CROSS REFERENCE TO RELATED APPLICATIONS

This application is based upon and claims the benefit of priority of the prior Japanese Patent Application No. 2020-192825, filed on Nov. 19, 2020, the entire contents of which are incorporated herein by reference.

BACKGROUND OF THE INVENTION

1. Field of the Invention

Embodiments of the invention relate to a module-type semiconductor device and method of manufacturing a module-type semiconductor device.

2. Description of the Related Art

Recently, power semiconductor modules have come to be widely used in power converting equipment with a focus on power semiconductor modules (hereinafter, IGBT power modules) implementing (mounted with) an insulated gate bipolar transistor (IGBT) as a power semiconductor device element. A power semiconductor module is a module-type semiconductor device integrating, as a single unit (functional unit), multiple components and circuits including a power semiconductor device element such as an IGBT, a diode, etc.

A power semiconductor module has a structure in which one or more power semiconductor device elements implementing all or a portion of functions such as conversion (conversion of input signals such as for voltage, current, frequency, etc.), connection (turning an external component ON/OFF) are built into a semiconductor chip that is electrically insulated from a metal base substrate or a cooling base bonded to the metal base substrate. A structure of a conventional power semiconductor module is described taking a general IGBT power module as an example. FIG. 10 is a cross-sectional view schematically depicting a structure of a conventional module-type semiconductor device.

A conventional module-type semiconductor device 110 depicted in FIG. 10 is a power semiconductor module in which a semiconductor chip 101 having an IGBT formed therein as a power semiconductor device element is mounted to a circuit board 102. A back surface of the semiconductor chip 101 is soldered to a conductive plate 122 on a front surface of the circuit board 102. A metallic foil 123 on a back surface of the circuit board 102 is soldered to a front surface of a metal base substrate 103. The circuit board 102 is a stacked substrate in which the conductive plate 122 and the metallic foil 123 are respectively provided on opposite surfaces of an insulated substrate 121.

A resin-molded case 104 is adhered to a peripheral edge of the metal base substrate 103. The circuit board 102 is housed in a box-shaped recess 109 surrounded by the metal base substrate 103 and the case 104, having the front surface of the metal base substrate 103 as a bottom and inner walls 104a of the case 104, orthogonal to the metal base substrate 103, as sidewalls. External connection terminals 105 are integrally molded (insert-molded) and fixed to the case 104. The external connection terminals 105 are rod-shaped wiring members each having an L-shape in a cross-sectional view thereof.

First ends of the external connection terminals 105 are exposed outside the case 104. Second ends of the external connection terminals 105 are exposed in the recess 109 and are electrically connected to the conductive plate 122 of the front surface of the circuit board 102, a surface electrode of a front surface of the semiconductor chip 101, etc., by wiring 106. A cover 107 is fitted to the inner walls 104a of the case 104 and is disposed facing the front surface of the metal base substrate 103, thereby closing an opening of the recess 109. The cover 107 is formed using same resin used to form the case 104.

The recess 109 is filled with an encapsulant 108 containing a silicone gel. The encapsulant 108 covers and electrically insulates side surfaces (surfaces of the insulated substrate 121 and ends of the metallic foil 123) of the circuit board 102, the semiconductor chip 101 and the conductive plate 122 of the front surface of the circuit board 102, and the wiring 106, etc., thereby providing mechanical, physical, and chemical protection from an external environment. A cooling base is bonded to a back surface of the metal base substrate 103. The cooling base conducts heat to a heat dissipating fin, the heat being generated by the semiconductor chip 101 and transmitted through the circuit board 102.

As a conventional power semiconductor module, a semiconductor module having a structure in which a semiconductor chip is housed and sealed in a recess formed by adhering a case to a periphery of a metal base substrate has been proposed and in the semiconductor module, an intermediate layer that mitigates stress placed on the encapsulant by an adhesive is provided between the encapsulant and portions of the metal base substrate and the case adhered to each other by the adhesive (for example, refer to Japanese Laid-Open Patent Publication No. 2018-195726). Japanese Laid-Open Patent Publication No. 2018-195726 discloses that the intermediate layer is formed by mixing an additive such as a silicone rubber into a resin composition containing a thermosetting resin such as an epoxy resin.

Further, Japanese Laid-Open Patent Publication No. 2018-195726 discloses that elastic modulus of the intermediate layer is in a range from about 3 GPa to 10 GPa, lower than elastic modulus of the encapsulant and greater than elastic modulus of the adhesive. Further, it is disclosed that when the additive such as a silicone rubber having a low elastic modulus in a range from about 1 MPa to 10 MPa is mixed into the resin composition in excess of a predetermined amount, strength of the intermediate layer in terms of the resin composition decreases and therefore, an additive having a high elastic modulus (about 1 GPa to 10 Pa) is mixed into the resin composition, reducing a compounding ratio of the additive, whereby decreases in the strength of the intermediate layer are suppressed.

SUMMARY OF THE INVENTION

According to an embodiment of the invention, a module-type semiconductor device includes a substrate having a first main surface; a semiconductor chip and a conductive plate mounted on the first main surface of the substrate; a case adhered to a peripheral edge of the substrate, surrounding a periphery of the first main surface of the substrate, the case having a plurality of inner walls; a recess having box-like shape, the first main surface of the substrate forming a bottom of the recess and the inner walls of the case forming sidewalls of the recess, the recess housing therein, the semiconductor chip and the conductive plate; an encapsulant covering the semiconductor chip and the conductive plate; a cover disposed in the case and having a plurality of side surfaces, the cover further having a second main surface and a third main surface opposite to each other, the cover disposed closing an opening of the recess with the second main surface of the cover facing the first main surface of the substrate, and the semiconductor chip and the conductive plate intervening therebetween; and a first adhesive layer adhering the inner walls of the case to the side surfaces of the cover, closing a first gap between the case and the cover. The first adhesive layer has a first protruding portion, or a second protruding portion, or both the first protruding portion and the second protruding portion, the first protruding portion protruding outward from the first gap while being in contact with the inner walls of the case and the third main surface of the cover, and the second protruding portion protruding into the recess from the first gap while being in contact with the inner walls of the case and the second main surface of the cover.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a table showing results of verification of reliability of a sealing material layer of a first example.

DETAILED DESCRIPTION OF THE INVENTION

Figure 1:
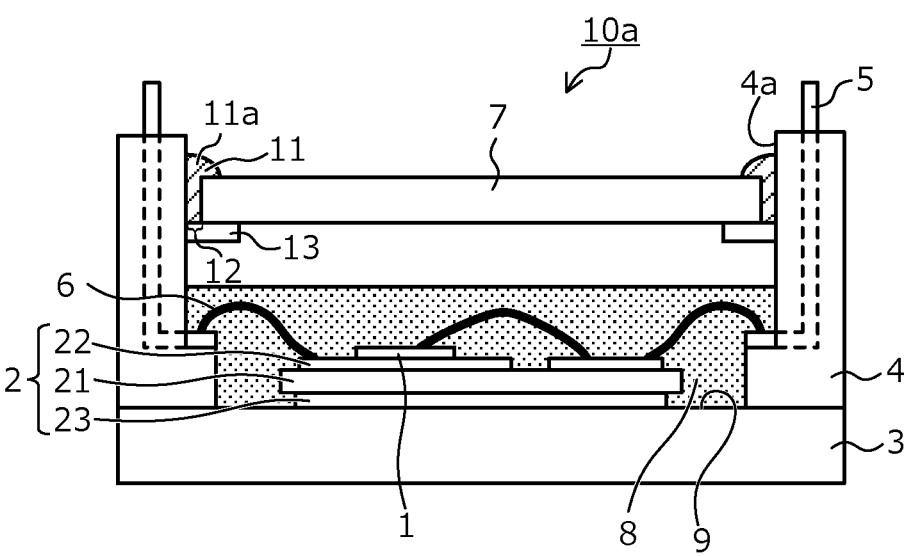
FIG. 1 is a cross-sectional view schematically depicting a structure of a module-type semiconductor device according to an embodiment.

First, problems associated with the conventional techniques are described. Recently, with the spread of inverters for driving electric motors, environments under which power semiconductor modules are used have become diverse and use under corrosive gas environments such as hydrogen sulfide ($H_2S$) is increasing. Further, the amount of heat that a power semiconductor module generates is increasing due to increases in capacity and use under high temperatures. On the other hand, under a sulfide gas atmosphere environment in an environment where vulcanization/desulfurization processes are performed such as at a wastewater treatment plant, a paper mill, a tire manufacturing factory, etc., an inverter system including a power semiconductor module (the conventional module-type semiconductor device 110 depicted in FIG. 10 described above) is installed.

As described above, in the conventional module-type semiconductor device 110, the cover 107 that closes the opening of the recess 109 is merely fitted to the inner walls 104a of the case 104 and therefore, under a corrosive gas environment, corrosive gas penetrates into the recess 109 from gaps between the case 104 and the cover 107. The silicone gel (the encapsulant 108) covering components and circuits such as the circuit board 102 and the semiconductor chip 101 in the recess 109 has high permeability for gas and therefore, the corrosive gas that penetrates into the recess 109 penetrates through the silicone gel and reaches the components and circuits beneath the silicone gel.

In this manner, the components and circuits in the recess 109 are corroded by the corrosive gas that penetrates through the silicone gel, whereby the components and circuits breakdown in a short period of time. While filling the gaps between the case 104 and the cover 107 with a sealing material layer (not depicted) may prevent penetration of the corrosive gas into the recess 109, a problem arises in that due to thermal stress caused by temperature increases of the environment of use and the heat generated by the power semiconductor module, warping and twisting of the power semiconductor module itself occur, whereby cracks in the sealing material layer occur and from portions of the sealing material layer where the cracks occur, water and corrosive gas penetrate into the recess 109.

Embodiments of a module-type semiconductor device and a method of manufacturing a module-type semiconductor device according to the present invention are described in detail with reference to the accompanying drawings. In the description of the embodiments below and the accompanying drawings, main portions that are identical will be given the same reference numerals and will not be repeatedly described.

Figure 2:
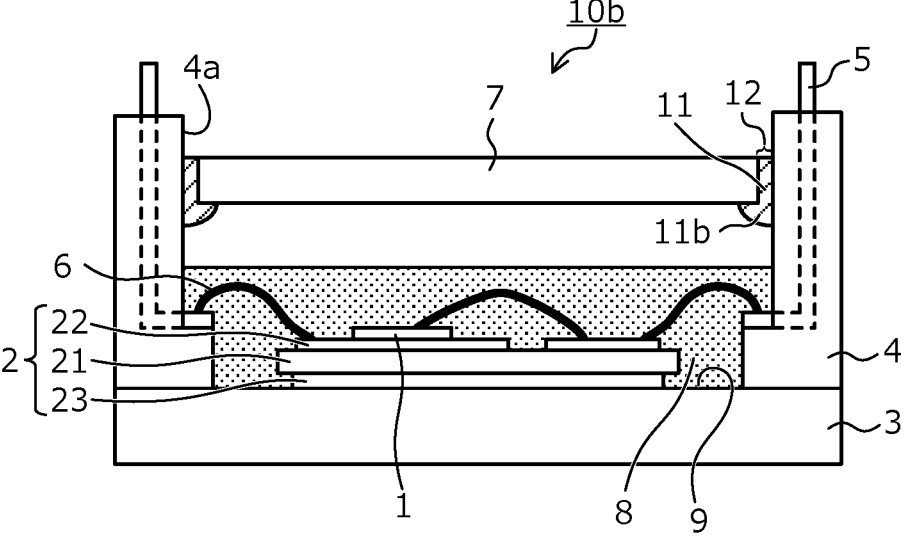
FIG. 2 is a cross-sectional view schematically depicting another example of the structure of the module-type semiconductor device according to the embodiment.
Figure 3:
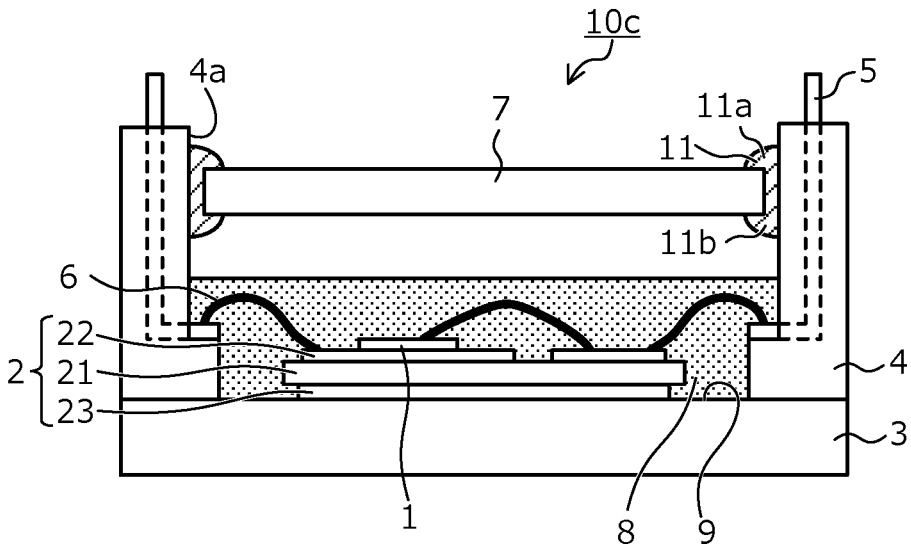
FIG. 3 is a cross-sectional view schematically depicting another example of the structure of the module-type semiconductor device according to the embodiment.
Figure 4:
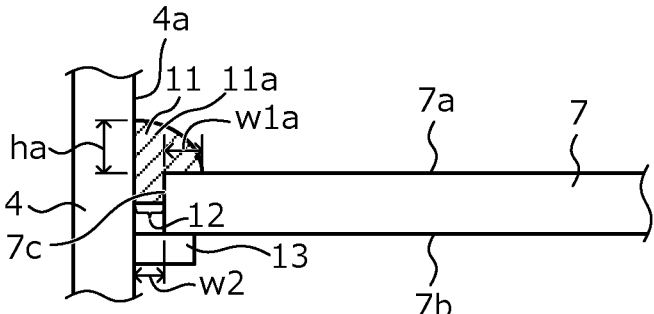
FIG. 4 is an enlarged view of a portion of FIG. 1.
Figure 5:
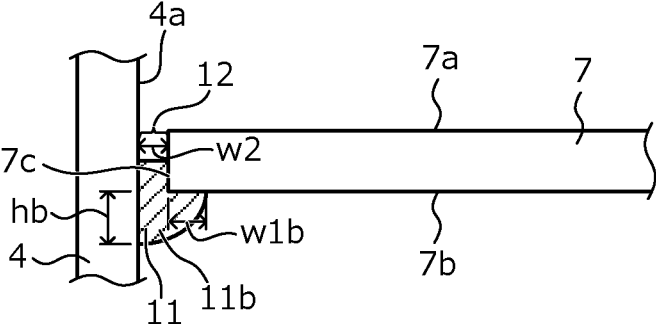
FIG. 5 is an enlarged view of a portion of FIG. 2.
Figure 6:
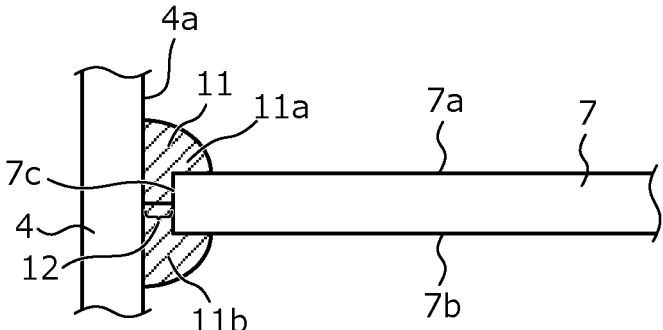
FIG. 6 is an enlarged view of a portion of FIG. 3.
Figure 7:
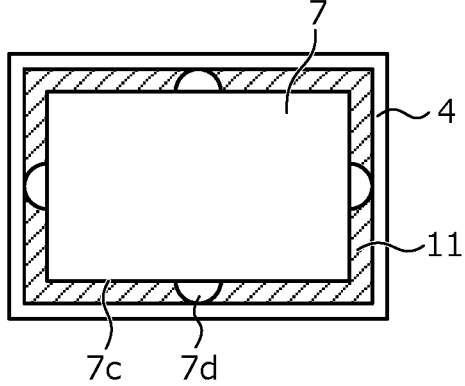
FIG. 7 is a plan view of a state when another example of the module-type semiconductor device according to the embodiment is viewed from a cover 7.

A structure of a module-type semiconductor device according to an embodiment is described. FIG. 1 is a cross-sectional view schematically depicting the structure of the module-type semiconductor device according to the embodiment. FIGS. 2 and 3 are cross-sectional views schematically depicting other examples of the structure of the module-type semiconductor device according to the embodiment. FIGS. 4, 5, and 6 are enlarged views of portions of FIGS. 1 to 3, respectively. FIGS. 4 to 6 depict enlarged views of a sealing material layer (first adhesive layer) 11. FIG. 7 is a plan view of a state when another example of the module-type semiconductor device according to the embodiment is viewed from a cover 7.

Module-type semiconductor devices 10a, 10b, 10c according to the embodiment depicted in FIGS. 1 to 3 are power semiconductor modules in which at least one semiconductor chip 1 on which a power semiconductor device element is formed is implemented (mounted) on a circuit board 2. On the semiconductor chip 1, for example, an IGBT, a diode, etc. is formed as a power semiconductor device element. The semiconductor chip 1 may contain a semiconductor material such as silicon (Si), silicon carbide (SiC), gallium nitride (GaN), etc. The semiconductor chip 1 may include multiple semiconductor chips 1 of differing semiconductor materials implemented on the circuit board 2 that is a single circuit board.

For example, the module-type semiconductor devices 10a to 10c according to the embodiment each may be a hybrid semiconductor module in which of the multiple semiconductor chips 1, one semiconductor chip 1 on which an Si-IGBT is formed and another semiconductor chip 1 on which a Schottky barrier diode (SiC-SBD) is formed are mounted on the circuit board 2. The multiple semiconductor chips 1 may be mounted on the circuit board 2 that is a single circuit board, or the circuit board 2 main include multiple circuit boards 2 and the multiple semiconductor chips 1 may be respectively mounted on the multiple circuit boards 2.

A surface electrode of a back surface of the semiconductor chip 1 (back electrode) is bonded to a first conductive plate 22 of a front surface of the circuit board 2 by, for example, solder. A second conductive plate 23 of a back surface of the circuit board 2 is bonded to a front surface (first main surface) of a metal base substrate 3. The circuit board 2 is a stacked substrate having an insulated substrate 21, and the first and the second conductive plates 22, 23 on surfaces of the insulated substrate 21, respectively. The first conductive plate 22 is formed on a front surface of the insulated substrate 21 by a predetermined circuit pattern. The second conductive plate 23 is a metallic foil formed in an entire area of a back surface of the insulated substrate 21.

A material of the insulated substrate 21 is a material with favorable electrical insulation and thermal conductivity such as, for example, alumina ($Al_2O_3$), aluminum nitride (AlN), silicon nitride (SiN), etc. In particular, for high withstand voltage applications, while a material of the insulated substrate 21 may have both electrical insulation and thermal conductivity, this not a limitation and, for example, may be AlN or SiN. The first and the second conductive plates 22, 23 may be formed using a metal such as copper (Cu) or aluminum (Al) having favorable workability and a surface thereof may be processed by a plating treatment of, for example, nickel (Ni) which has an anti-corrosion effect.

The first and the second conductive plates 22, 23, for example, may be directly bonded to the insulated substrate 21 using a direct copper bonding method or may be bonded to the insulated substrate 21 via a brazing material using an active metal brazing method. FIGS. 1 to 3 depict an instance in which the first conductive plate 22 includes two (2) first conductive plates 22 disposed (mounted) separate from each other on the front surface of the insulated substrate 21, with the semiconductor chip 1 bonded to one of the first conductive plates 22 (left-hand side) and an external connection terminal (wiring member) 5 electrically connected to the other of the first conductive plate 22 (right-hand side).

The metal base substrate 3 is a heat sink having, for example, a substantially rectangular shape in a plan view thereof and formed using a metal such as Cu or Al, which has favorable thermal conduction. A surface of the metal base substrate 3 may be covered by a Ni alloy film or a Ni film having a corrosion preventative effect. A back surface of the metal base substrate 3 is bonded to a cooling base portion (not depicted). A cooling base conducts heat generated by a circuit pattern (the first conductive plate 22) of the circuit board 2 or the semiconductor chip 1 to a heat dissipating fin via the circuit board 2. The heat dissipating fin has multiple heat dissipating fins and dissipates the heat conducted from the cooling base portion. The metal base substrate 3 itself may be a cooling device such as the heat dissipating fins.

A lower end of a case 4 formed using a resin is adhered to a peripheral edge of the metal base substrate 3. The case 4 has a substantially rectangular tube shape and surrounds a periphery of the front surface of the metal base substrate 3. A box-shaped recess 9 is formed having the front surface of the metal base substrate 3 as a bottom and inner walls 4a of the case 4 orthogonal to the front surface of the metal base substrate 3 as sidewalls. Circuits and components such as the semiconductor chip 1 and the circuit board 2 are housed in the recess 9. A material of the case 4 is, for example, a thermosetting resin such as a thermoplastic resin or a phenol resin like a polyphenylene sulfide resin (PPS) or a polybutylene terephthalate resin (PBT).

At least one external connection terminal 5 is integrally molded (for example, insert-molded) and fixed to the case 4. Each external connection terminal 5 is a rod-shaped wiring member for leading out potential of different circuits and components in the recess 9 and has, for example, an L-shape in a cross-sectional view thereof. A first linear portion of the L-shape of the external connection terminal 5 is insert-molded to the case 4 in an upright state with respect to the front surface of the metal base substrate 3, an open end thereof (first end of the external connection terminal 5) is exposed outside the recess 9 from an upper end (end opposite to that facing the metal base substrate 3) of the case 4.

A second linear portion of the L-shape of the external connection terminal 5 extends parallel to the front surface of the metal base substrate 3, an open end thereof (second end of the external connection terminal 5) is exposed inside the recess 9. The second end of the external connection terminal 5 is electrically connected to a surface electrode (front electrode) of the front surface of the semiconductor chip 1, the first conductive plate 22 of the circuit board 2, etc. by wiring 6. The wiring 6 is, for example, an aluminum bonding wire (thin metal wire). Instead of the wiring 6, for example, a lead (conductor) wider than a bonding wire may be disposed.

Further, a cover receiving part 13 having a protruding shape may be provided in the case 4, near the upper end of the case 4, along an entire periphery of the inner walls 4a. The cover receiving part 13 has a function of holding the cover 7 described hereinafter at a predetermined position. The cover receiving part 13 has a predetermined width protruding in the recess 9, in a direction orthogonal to the inner walls 4a of the case 4 and capable of holding an end of the cover 7. The cover receiving part 13 may be provided in a substantially rectangular shape along the entire periphery of the inner walls 4a of the case 4 or may be selectively provided at positions of a same height (a same distance from the front surface of the metal base substrate 3) on the inner walls 4a of the case 4.

The cover 7 is disposed in contact with an upper surface of the cover receiving part 13 (surface on a side opposite to that facing the metal base substrate 3), the cover 7 being held at a predetermined position along the inner walls 4a of the case 4 by the cover receiving part 13. The cover 7 faces the front surface of the metal base substrate 3, closing an opening of the recess 9. The cover 7, as depicted in FIG. 1, may be provided in the recess 9, preferably. The cover 7 is disposed in the recess 9 (inside the case 4) and a sealing material having predetermined mechanical characteristics is used as a material of a later-described sealing material layer 11, whereby cracking and peeling of the sealing material layer 11 may be prevented with respect to deformation of the case 4 (module) due to thermal stress.

The cover 7 has a substantially rectangular shape having a width substantially equal to an inner dimension of the case 4 (width of the recess 9) or slightly smaller than the inner dimension of the case 4. Coefficient of linear expansion of the cover 7 and the case 4 being in a range from $1 \times 10^{-5}$/K to $5 \times 10^{-5}$/K may be preferable from a viewpoint of thermal stress applied to the sealing material layer 11. Further, preferably, the cover 7 may be configured using a same resin as that used to configure the case 4. When the cover 7 and the case 4 are a same type of resin member, the coefficient of linear expansion of the case 4 and the coefficient of linear expansion of the cover 7 are about the same and the thermal stress applied to the sealing material layer 11 may be reduced and is, thus, preferable. Side surfaces 7*c* of the cover 7 are adhered to the inner walls 4*a* of the case 4 via the sealing material layer 11.

As described hereinafter, while an encapsulant 8 containing a silicone gel having a low elastic modulus is injected in an interior of the recess 9, instead of the encapsulant 8, epoxy resin may be injected in the interior. In this instance, a non-depicted primer layer may be stacked on the circuits and the components such as the semiconductor chip 1, the circuit board 2, and the wiring 6 in the recess 9, so as to cover the circuits and components. The primer layer has a function of enhancing adhesiveness between a metal therebelow (the front electrode of the semiconductor chip 1, the first conductive plate 22 of the circuit board 2), a conductive wiring member such as the wiring 6 and the encapsulant, a function of mitigating stress, and a function of preventing absorption of the later-described encapsulant 8 by a layer therebelow. The primer layer is, for example, a layer containing a resin containing a polyamide, polyimide, or polyamide-imide.

The encapsulant 8 containing a silicone gel having a low elastic modulus is injected in the interior of the recess 9 instead of the encapsulant 8. In particular, preferably, the elastic modulus of the encapsulant 8 may be at most about 100 MPa. In an instance in which wiring connection in the recess 9 is wire bonding, when the elastic modulus of the encapsulant 8 exceeds the range described above, the wiring 6 may disconnect and therefore, is not desirable. The encapsulant 8 covers and protects side surfaces of the circuit board 2 (surface of the insulated substrate 21 and ends of the second conductive plate 23) as well as circuits and components such as the first conductive plate 22, the semiconductor chip 1 of the front surface of the circuit board 2, and the wiring 6, the encapsulant 8 providing electrical insulation from the external environment as well as mechanical, physical, and chemical protection from the external environment. The encapsulant 8 may be in contact with a surface (hereinafter, lower surface (second main surface)) 7*b* of the cover 7, the surface facing the metal base substrate 3.

Waviness and unevenness may occur at the surface of the encapsulant 8 and in this instance, the cover 7 has a mixture of portions in contact with the encapsulant 8 and portions having an air layer intervening therebetween. Therefore, stress applied to the cover 7 from a lower side thereof (side facing the encapsulant 8) is not uniform and therefore, the cover 7 may be provided via an air layer having a thickness in a range from 0.1 mm to 1 mm between the cover 7 and the encapsulant 8. Further, stress received via the air layer is lower than stress applied directly to the cover 7 by the encapsulant 8 and from this perspective, provision of the cover 7 via the air layer may be preferable.

The sealing material layer 11, from a surface (hereinafter, upper surface (third main surface)) 7*a* of the cover 7 opposite to the surface thereof facing the metal base substrate 3, is embedded in a gap (first gap) 12 between the case 4 and the cover 7, intervening between the inner walls 4*a* of the case 4 and side walls (ends) 7*c* of the cover 7. The sealing material layer 11 closes the gap 12 between the case 4 and the cover 7 along an entire periphery of the gap 12. The inner walls 4*a* of the case 4 and the side surfaces 7*c* of the cover 7 are adhered to each other via the sealing material layer 11, whereby the interior of the recess 9 is sealed. The sealing material layer 11 may be in contact with (adhered to) the cover receiving part 13.

Further, the sealing material layer 11 is in contact with the inner walls 4*a* of the case 4 and the upper surface 7*a* of the cover 7 along the entire periphery of the gap 12 between the case 4 and the cover 7, and has a first protruding portion 11*a* protruding outward from the gap 12 between the case 4 and the cover 7. Along the inner walls 4*a* of the case 4, the first protruding portion 11*a* of the sealing material layer 11 extends on the inner walls 4*a* of the case 4 in a direction (upward) away from the upper surface 7*a* of the cover 7, protruding to have a predetermined height (length) ha from the upper surface 7*a* of the cover 7. The first protruding portion 11*a* of the sealing material layer 11 extends along the upper surface 7*a* of the cover 7 in a direction away from the inner walls 4*a* of the case 4 to have a predetermined width w1*a* on the upper surface 7*a* from the side surface 7*c* of the cover 7 (refer to FIG. 4).

The first protruding portion 11*a* is provided to the sealing material layer 11, whereby sealing of the interior of the recess 9 is ensured. The height ha and the width w1*a* of the first protruding portion 11*a* of the sealing material layer 11 may each be in a range, for example, from about 1 mm to 2.5 mm. The height ha and the width w1*a* of the first protruding portion 11*a* of the sealing material layer 11 are set to be at least the lower limit described above, whereby sealing of the interior of the recess 9 may be further enhanced. When the height ha and the width w1*a* of the first protruding portion 11*a* of the sealing material layer 11 exceed the upper limit described above, the sealing property of the interior of the recess 9 decreases and therefore, is not desirable. In particular, with respect to deformation of the case 4 (module) due to thermal stress, distortion of the sealing material layer 11 exposed externally increases and the sealing material layer 11 easily peels from the case 4 and the cover 7.

For a material of the sealing material layer 11 for example, an adhesive sealing may be used. Sealing is enhancement of sealability (for example, air-tightness and water-tightness) by filling seams and gaps with a predetermined material constituting an adhesive and thereby, closing the seams and gaps. Further, preferably, a material of the sealing material layer 11 may be, for example, an ambient-temperature-curing adhesive (resin) that cures at a temperature between about 10 degrees C. and 50 degrees C. without heating. A reason for this is that when a heat-cured adhesive (resin) is heated and cured, the encapsulant 8 expands and voids between the cover 7 and the encapsulant 8 expand, whereby internal pressure of the case 4 increases.

Due to the rise of the internal pressure of the case 4, gaps between the adhesive, the cover 7, and the case 4 are generated before the heat-cured adhesive is cured, whereby a problem arises in that the sealability of the case 4 is adversely affected. In particular, when the encapsulant 8 is a silicone gel, the coefficient of linear expansion of the encapsulant 8 is large, whereby the internal pressure of voids between the cover 7 and the encapsulant 8 increases and the sealability of the case 4 decreases. Therefore, as described above, preferably, a material of the sealing material layer 11 may be an ambient-temperature-curing adhesive. In particular, for the material of the sealing material layer 11, a condensation-reaction silicone-based adhesive that is cured by reacting with moisture in the air may be used such as, for example, a silicone adhesive KE-4948-G (trademark) of Shin-Etsu Chemical Co., Ltd. (registered trademark).

Use of a condensation-reaction adhesive of an ambient-temperature-curing type, having a short tack-free time (dry-to-touch time), as the material of the sealing material layer 11 eliminates a need for a heat treatment for curing the material after the material of the sealing material layer 11 is applied to predetermined sites. Therefore, the sealing material layer 11 may be formed in a short period of time and manufacturing processes may be simplified. Young's modulus of the sealing material layer 11, for example, may be adjusted by adding a suitable amount of an additive (cross-linking agent) to a silicone-based adhesive; the additive increases crosslinking density between atoms or molecules. The additive of the sealing material layer 11, for example, is a polyfunctional silane compound having an acetoxy group, an alkoxy group, and a ketoxime, etc.

Viscosity of the material of the sealing material layer 11 may be, for example, in a range from about 50 Pa·s (Pascal·seconds) to 300 Pa·s at room temperature (about 25 degrees C.). When the viscosity of the material of the sealing material layer 11 is within the above range, the sealing material layer 11 may be formed at predetermined sites without the material of the sealing material layer 11 being scattered, the material of the sealing material layer 11 dripping, or voids being formed in the sealing material layer 11. In particular, in an instance in which the material of the sealing material layer 11 is an ambient-temperature-curing adhesive, the material of the sealing material layer 11 cures in a short period of time and therefore, to form the sealing material layer 11 at predetermined sites, preferably, the viscosity of the material of the sealing material layer 11 may be within the above-described range.

A width w2 of the gap 12 between the case 4 and the cover 7 may be, for example, in a range from about 1 mm to 3 mm. The viscosity of the material of the sealing material layer 11 and the width w2 of the gap 12 between the case 4 and the cover 7 are set as the conditions above, whereby the sealing material layer 11 is disposed at predetermined positions and a predetermined shape of the sealing material layer 11 is maintained, thereby enabling sealability of the interior of the recess 9 to be ensured.

In an instance in which the sealing material layer 11 is embedded in the gap 12 between the case 4 and the cover 7 of the module-type semiconductor devices 10a to 10c, Young's modulus of the sealing material layer 11 may be, for example, in a range from about 1 MPa to 50 MPa. Young's modulus of the sealing material layer 11 is set within the range above, whereby generation of cracks in the sealing material layer 11 due to mechanical impact (stress) and/or thermal shock may be prevented, thereby enabling sealability of the interior of the recess 9 to be ensured. For applications not requiring impact resistance, Young's modulus of the sealing material layer 11 may be increased to be in a range not exceeding about 60 MPa.

In forming the sealing material layer 11, for example, circuits and components such as the semiconductor chip 1 and the circuit board 2, etc. housed in the recess 9 are sealed by the encapsulant and thereafter, the cover 7 is disposed at a predetermined position in contact with the upper surface of the cover receiving part 13, thereby closing the opening of the recess 9. Thereafter, the material (first adhesive) of the sealing material layer 11 suffices to be applied and embedded along the entire periphery of the gap 12 between the case 4 and the cover 7, from thereabove (the upper surface 7a of the cover 7). The gap 12 between the case 4 and the cover 7 is embedded with the sealing material layer 11, and a portion of the material of the sealing material layer 11 left not embedded in the gap 12 between the case 4 and the cover 7 is the first protruding portion 11a having a fan-like shape in a cross-sectional view thereof, protruding upward from the gap 12.

In an instance in which a material that is cured by heating is used for the material of the sealing material layer 11, the material of the sealing material layer 11 is applied and thereafter, for example, a heat treatment at a temperature in a range from about 80 degrees to 150 degrees C. is performed for about 10 minutes to 1 hour. In an instance in which a heat treatment for curing the sealing material layer 11 such as this is performed, defects in the sealing material layer 11 are generated by fluctuations of the pressure in the power semiconductor module. Therefore, as described above, preferably, the material of the sealing material layer 11 may be a material not requiring a heat treatment for curing the material of the sealing material layer 11.

Instead of the first protruding portion 11a, the sealing material layer 11 may have a second protruding portion 11b protruding into the interior of the recess 9 from the gap 12 between the case 4 and the cover 7 by applying the material (second adhesive) of the sealing material layer 11 in the first gap. The first adhesive and the second adhesive can be the same material. The second protruding portion 11b is in contact with the inner walls 4a of the case 4 and the lower surface 7b of the cover 7, and embodied along the entire periphery of the gap 12 between the case 4 and the cover 7 (refer to FIGS. 2 and 5). Along the inner walls 4a of the case 4, the second protruding portion 11b of the sealing material layer 11 extends on the inner walls 4a of the case 4 in a direction (downward) away from the lower surface 7b of the cover 7, protruding to have a predetermined height (length) hb from the lower surface 7b of the cover 7. The second protruding portion 11b of the sealing material layer 11 extends along the lower surface 7b of the cover 7 in a direction away from the inner walls 4a of the case 4 to have a predetermined width w1b on the lower surface 7b of the cover 7 from the side surfaces 7c of the cover 7.

In this instance, in forming the sealing material layer 11, for example, when the cover 7 is attached, the material of the sealing material layer 11 is applied to an entire periphery of the end of the lower surface 7b of the cover 7 in advance and thereafter, the cover 7 suffices to be fitted together with the inner walls 4a of the case 4 and pushed downward (toward the metal base substrate 3) to a predetermined position. As a result, the material of the sealing material layer 11 is embedded in the gap 12 between the case 4 and the cover 7 from therebelow, and a portion of the material of the sealing material layer 11 left not embedded in the gap 12 between the case 4 and the cover 7 is the second protruding portion 11b having a fan-like shape in a cross-sectional view thereof, protruding into the recess 9 from the gap 12.

The sealing material layer 11 may have both the first and the second protruding portions 11a, 11b (refer to FIGS. 3 and 6). In this instance, in forming the sealing material layer 11, after the cover 7 is fitted between the inner walls 4a of the case 4 so as to form the second protruding portion 11b as described above, the material of the sealing material layer 11 suffices to be applied to the entire periphery of the gap 12 between the case 4 and the cover 7 from above (from the upper surface 7a of the cover 7). The material of the sealing material layer 11 embedded in the gap 12 between the case 4 and the cover 7 from thereabove and the material of the sealing material layer 11 embedded from therebelow may be in contact with each other or may be separate from each other.

In an instance in which the sealing material layer 11 has the second protruding portion 11b, the cover receiving part 13 may be omitted (refer to FIGS. 2, 3, 5, and 6). Preferably, respective numerical ranges of the height (downward protruding height) hb and the width w1b of the second protruding portion 11b of the sealing material layer 11 may be equal to preferable respective numerical ranges of the height (upward protruding height) ha and the width w1a of the first protruding portion 11a of the sealing material layer 11, respectively. Dimensions of the first and the second protruding portions 11*a*, 11*b* of the sealing material layer 11 suffice to satisfy the preferable numerical ranges described and may be substantially the same dimensions or may be different dimensions.

As described above, of the material applied to form the sealing material layer 11, the first and the second protruding portions 11*a*, 11*b* of the sealing material layer 11 are formed by portions respectively left on the upper surface 7*a* of the cover 7 and the lower surface 7*b* without being embedded in the gap 12 between the case 4 and the cover 7. Therefore, as described above, the first and the second protruding portions 11*a*, 11*b* of the sealing material layer 11 are set having predetermined conditions for the width w2 of the gap 12 between the case 4 and the cover 7 and the viscosity of the material of the sealing material layer 11 and thus, may be formed in a predetermined shape.

In addition to the gap 12 between the case 4 and the cover 7, a sealing material layer (not depicted, second adhesive layer) having a structure similar to that of the sealing material layer 11 may be provided in other gaps (non-depicted second gaps) generated between the interior of the recess 9 and the exterior. Other gaps generated between the interior of the recess 9 and the exterior, for example, include a gap generated between the case 4 and the external connection terminal 5. In an instance in which a sealing material layer is formed in a gap between the case 4 and the external connection terminal 5, the sealing material layer, under conditions substantially similar to those for the first protruding portion 11*a*, has a protruding portion (fourth protruding portion) that protrudes in a fan-like shape in a cross-sectional view thereof, in a direction away from respective surfaces of the upper end of the case 4 and the external connection terminal 5. Thermal stress also occurs in the case 4 and the external connection terminal 5, whereby a gap between the case 4 and the external connection terminal 5 is easily generated; however, by setting the sealing material layer embedded in this gap between the case 4 and the external connection terminal 5 to have the shape and mechanical characteristics according to the present embodiment, peeling and cracking of the sealing material layer is suppressed, enabling sealing characteristics of the case 4 to be maintained.

Protruding portions (third protruding portions) 7*d* may be provided at the side surfaces 7*c* of the cover 7 (refer to FIG. 7). For example, the protruding portions 7*d* are respectively provided on the 4 sides of the cover 7 having a substantially rectangular shape in a plan view thereof. Further, preferably, the protruding portions 7*d* may be disposed in center portions of each of the sides of the cover 7. Further, the protruding portions 7*d* are provided so as to overhang outwardly (toward the inner walls 4*a* of the case 4), parallel to planar portions (the upper surface 7*a*, the lower surface 7*b*) of the cover 7. At the protruding portions 7*d*, the cover 7 is in contact with the inner walls 4*a* of the case 4 and fitted together with the inner walls 4*a* of the case 4.

The protruding portions 7*d* of the side surfaces 7*c* of the cover 7 in a plan view thereof each has a shape that suffices to be an arc-shape (i.e., semicircular) in contact with one of the inner walls 4*a* of the case 4 at one point on the arc. As a result, stress applied to the protruding portions 7*d* of the side surfaces 7*c* of the cover 7 may be reduced. Corresponding to deformation of the case 4 (module) due to thermal stress, compressive stress from the side surfaces 7*c* of the cover 7 and tensile stress toward the side surfaces 7*c* of the cover 7 are applied to the sealing material layer 11 and bending stress causing twisting is further applied; however, the protruding portions 7*d* are present at the side surfaces 7*c* of the cover 7, whereby these stresses applied to the sealing material layer 11 may be reduced.

Gaps between the inner walls 4*a* of the case 4 and the protruding portions 7*d* of the side surfaces 7*c* of the cover 7 (portions other than points in contact with the case 4) are filled with the sealing material layer 11. The protruding portions 7*d* of the side surfaces 7*c* of the cover 7 are applicable to all of the module-type semiconductor devices 10*a* to 10*c* depicted in FIGS. 1 to 3. The first and the second protruding portions 11*a*, 11*b* of the sealing material layer 11 may be formed at an upper surface (the upper surface 7*a* of the cover 7) and a lower surface (the lower surface 7*b* of the cover 7) of the protruding portions 7*d* of the side surfaces 7*c* of the cover 7. The lower surface (surface facing the metal base substrate 3) of the protruding portions 7*d* of the side surfaces 7*c* of the cover 7 may be in contact with the cover receiving part 13 and the encapsulant 8.

For the sealing material layer 11, the power semiconductor module (the module-type semiconductor device 10*a*) depicted in FIG. 1 was experimentally fabricated and later-described reliability was evaluated. In particular, Young's modulus of the sealing material layer 11 was verified. FIG. 8 is a table showing results of verification of the reliability of a sealing material layer of a first example. For the first example, a comparison example, and a reference example, results of reliability by an impact test, a heat cycle test, and a corrosive gas test are shown in FIG. 8. The first example is the module-type semiconductor device 10*a* according to the embodiment depicted in FIGS. 1 and 4 described above. The comparison example differs from the first example in terms of the material of the sealing material layer. For the first example and the comparison example, multiple samples respectively having sealing material layers formed by materials for which Young's modulus differed were prepared.

The sealing material layer 11 of first to fourth samples of the first example were respectively formed by silicone-based adhesives (viscosity at room temperature being 120 Pa·s) for which Young's modulus was 1 MPa, 20 MPa, 50 MPa, and 60 MPa, respectively. First and second samples of the comparison example respectively had a sealing material layer formed by an epoxy resin for which Young's modulus was 2500 MPa and a sealing material layer formed by a polyurethane resin for which Young's modulus was 90 MPa. The reference example was the conventional module-type semiconductor device 110 (refer to FIG. 10) and other than no sealing material layer being provided (no sealing), the configuration was similar to that of the first example.

A stress-strain curve was measured by a lap shear test (Japanese Industrial Standards (JIS) K6850, etc.), from which Young's modulus of the sealing material layer was calculated. For first to fourth samples of the first example and the first and the second samples of the comparison example, the respective materials of the sealing material layers thereof were cured under standard curing conditions predetermined according to the material of the sealing material layer.

In the impact test, impact of an impact pulse (sine wave) for which acceleration (indicator of impact strength) was set as 500 G and impact duration (pulse width) was set as 1.0 ms was applied three (3) times in each direction X, Y, Z orthogonal to one another using a drop impact tester and thereafter, cracking of the sealing material layer was observed with a microscope. In the heat cycle test, temperature variation from −45 degrees C. to 155 degrees C. via room temperature was repeated 300 times. In the corrosive gas test, the semiconductor chip (IGBT chip) was left energized, under a hydrogen sulfide (H$_2$S) atmosphere of a concentration of 1000 ppm for 30 days.

From the results shown in FIG. 8, in the first example, in each of the first to the fourth samples, it was confirmed that inflow of corrosive gas into the power semiconductor module (interior of the recess 9) could be suppressed and the semiconductor chip 1 and the circuit board 2, etc. in the power semiconductor module were not corroded (corrosive gas test "OK"). Further, no problem due to ambient temperature changes (thermal shock) occurred in the first to the fourth samples (heat cycle test "OK"). Nonetheless, in the fourth sample (Young's modulus of the sealing material layer 11 was 60 MPa) of the first example, extremely small defects (cracks of a few μm or peeling of the sealing material layer 11, etc.) occurred between the sealing material layer 11 and adherend (the case 4 or the cover 7) due to mechanical impact (impact test "Δ"). However, these defects were of a magnitude not problematic, even with the heat cycle test and the corrosive gas test.

Therefore, it was confirmed that for applications not requiring mechanical impact resistance, Young's modulus of the sealing material layer 11 may be at most about 60 MPa and in an instance of use in an application requiring mechanical impact resistance such as on a vehicle, Young's modulus of the sealing material layer 11 may be more preferably at most 50 MPa (impact test "OK"). On the other hand, in the comparison example, it was confirmed that under actual use, defects (fissures, cracking of the sealing material layer) occurred between the sealing material layer and adherend due to mechanical impact and ambient temperature changes, sufficient sealability of the interior of the power semiconductor module was not obtained, and a corrosion suppression effect could not be obtained (impact test, heat cycle test, the corrosive gas test all "NG").

Further, it was confirmed that in the reference example, as the cover 107 is merely fitted together with the inner walls 104*a* of the case 104, in the corrosive gas test, corrosive gas penetrates into the recess 109 from a gap between the case 104 and the cover 107, and corrodes the semiconductor chip 101, the circuit board 102, etc. (impact test "OK", heat cycle test "OK", corrosive gas test "NG"). In the impact test in FIG. 8, "OK" indicates that no cracking or fissures occurred in the sealing material layer, "Δ" indicates that no cracking or fissures occurred in the sealing material layer in applications not requiring impact resistance, and "NG" indicates that cracking and/or fissures occurred in the sealing material layer sealing material layer.

In the heat cycle test in FIG. 8, "OK" indicates that no cracking or fissures occurred in the sealing material layer, and "NG" indicates that cracking and/or fissures occurred in the sealing material layer. In the corrosive gas test, "OK" indicates that sealability of the interior of the power semiconductor module could be secured and the circuits and the components in the power semiconductor module were not corroded; in the corrosive gas test, "NG" indicates that corrosive gas penetrated into the power semiconductor module and the circuits and the components in the power semiconductor module were corroded.

Figures 9, 10:
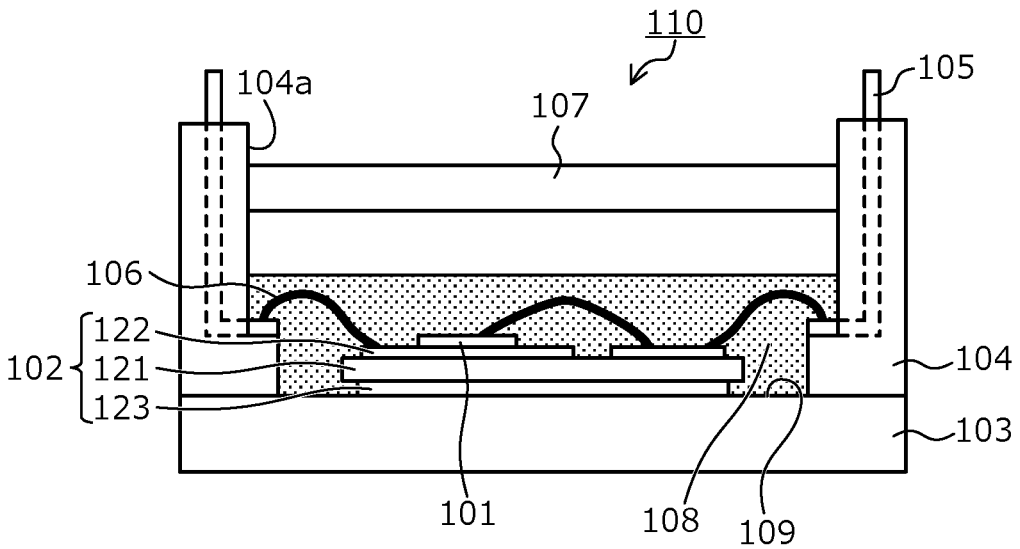
FIG. 9 is a table showing results of verification of a width of a gap between a case and a cover in a second example.
FIG. 10 is a cross-sectional view schematically depicting a structure of a conventional module-type semiconductor device.

Samples of the power semiconductor module depicted in FIG. 1, in which the width w2 of the gap 12 between the case 4 and the cover 7 was variously changed from 1 mm to 5 mm as depicted in FIG. 9 were fabricated and verified. FIG. 9 is a table showing results of verification of the width of the gap between the case and the cover in a second example. In an instance in which the width w2 of the gap 12 between the case 4 and the cover 7 is too large, the material of the sealing material layer 11 (sealing material) flows into the gap 12 between the case 4 and the cover 7 and the predetermined shape of the first and the second protruding portions 11*a*, 11*b* of the sealing material layer 11 becomes difficult to maintain. Further, when the material of the sealing material layer 11 flows into the gap 12 between the case 4 and the cover 7, the sealing material layer 11 is not formed at the predetermined positions.

When the sealing material layer 11 is not formed at the predetermined positions (the gap 12 between the case 4 and the cover 7, and the upper surface 7*a* or the lower surface 7*b* of the cover 7, or both), a contact area (hereinafter, sealed area) between the sealing material layer 11 and the inner walls 4*a* of the case 4, and a contact area (sealed area) between the sealing material layer 11 and the upper surface 7*a* of the cover 7 or the lower surface 7*b* (sealed area) or both vary, whereby the reliability of the sealing material layer 11 cannot be correctly evaluated and therefore, the sealing material layer 11 has to be maintained in the predetermined shape. Maintenance of the predetermined shape of the sealing material layer 11 is affected by the viscosity of the material of the sealing material layer 11.

The higher is the viscosity of the material of the sealing material layer 11, the better the shape of the sealing material layer 11 is maintained; however, workability is impaired. Thus, for the module-type semiconductor device 10*a* (hereinafter, the second example) according to the embodiment depicted in FIGS. 1 and 4 described above, a maximum allowable width for the width w2 of the gap 12 between the case 4 and the cover 7 was verified by variously changing the width w2 of the gap 12 between the case 4 and the cover 7 and the viscosity of the material of the sealing material layer 11 to fabricate multiple samples for which the sealed area of the sealing material layer 11 was confirmed; verification results are shown in FIG. 9.

For the second example, first samples in which the sealing material layer 11 was formed using a silicone-based adhesive (viscosity of 120 Pa·s at room temperature) similar to that of the sealing material layer 11 of the first example and second samples in which the sealing material layer 11 was formed by heating the silicone-based adhesive of the first sample by 80 degrees C. to intentionally thicken the silicone-based adhesive and adjust the viscosity thereof to about 300 Pa·s which does not interfere with application work were prepared. The three samples in which the width w2 of the gap 12 between the case 4 and the cover 7 was 1 mm, 3 mm, and 5 mm, respectively, were fabricated for the first samples and for the second samples of the second example.

From the results shown in FIG. 9, it was confirmed that in an instance in which the width w2 of the gap 12 between the case 4 and the cover 7 was at most 3 mm, the sealing material layer 11 (viscosity of material at room temperature being 120 Pa·s) of the first sample of the second example and the sealing material layer 11 (viscosity of the thickened material being 300 Pa·s) of the second sample of the second example were maintained in the predetermined shape and the predetermined sealed area was obtained (shape maintained "OK"). On the other hand, it was confirmed that in an instance in which the width w2 of the gap 12 between the case 4 and the cover 7 was 5 mm, in the second sample of the second example, the sealing material layer 11 was deformed and slightly smaller compared to the first sample, the sealed area of the sealing material layer 11 (shape maintained "Δ").

Therefore, it was confirmed that to ensure sealability of the interior of the power semiconductor module (interior of the recess 9), the width w2 of the gap 12 between the case 4 and the cover 7 is preferably not more than about 3 mm. In other words, preferably, the gap 12 between the case 4 and the cover 7 may be in a range from about 1 mm to 3 mm and the viscosity of the material of the sealing material layer 11 may be in a range from about 120 Pa·s to 300 Pa·s, whereby under these conditions, the sealing material layer 11 of a predetermined shape may be formed at a predetermined position.

In FIG. 9, "OK" indicates that the predetermined shape of the sealing material layer 11 is maintained and the predetermined sealed area of the sealing material layer 11 could be secured. "Δ" indicates that the sealing material layer 11 was slightly deformed, slightly displaced from the predetermined position, and the sealed area of the sealing material layer 11 was slightly smaller. While not depicted, results similar to those of the first and the second examples were obtained for the module-type semiconductor devices 10b, 10c according to the embodiment depicted in FIGS. 2 and 3 described above.

As described above, according to the embodiment, the sealing material layer having predetermined physical characteristics is embedded in gaps (gaps between the case and the cover, gaps between the case and external connection terminals) generated between the exterior and the interior of the power semiconductor module, thereby sealing the interior of the power semiconductor module. The sealing material layer has the first protruding portion protruding outward from a gap generated between the exterior and the interior of the power semiconductor module, or the second protruding portion protruding outward from a gap generated between the exterior and the interior of the power semiconductor module, or the sealing material layer has both the first and the second protruding portions.

The sealing material layer is provided in the gaps generated between the exterior and the interior of the power semiconductor module, whereby the gaps may be closed by the sealing material layer, thereby enabling sealing of the interior of the power semiconductor module. Further, the sealing material layer has the first protruding portion and/or the second protruding portion, whereby impact resistance of the sealing material layer may be enhanced, thereby enabling suppression of cracks in the sealing material layer. As a result, the penetration of corrosive gas from the exterior to the interior of the power semiconductor module may be reduced, enabling enhancement of the resistance of the power semiconductor module to corrosive gas.

Further, according to the embodiment, after components and circuits such as a semiconductor chip are mounted and sealed in the power semiconductor module, the sealing material layer is formed in the gaps generated between the exterior and the interior of the power semiconductor module. Therefore, even for application to an existing power semiconductor module, review of components and mounting conditions of the power semiconductor module is unnecessary, the performance and reliability of the existing power semiconductor module may be maintained, and resistance to corrosive gas may be added easily and inexpensively to the existing power semiconductor module.

In the foregoing, the present invention is not limited to the embodiment described above and various modifications within a range not departing from the spirit of the invention are possible.

According to the present invention, impact resistance of the first adhesive layer may be enhanced and the occurrence of cracking in the first adhesive layer may be suppressed.

The module-type semiconductor device and the method of manufacturing a module-type semiconductor device according to the present invention achieve an effect in that a module-type semiconductor device in which circuits and components are mounted and sealed in a case may be provided having high sealability.

As described above, the module-type semiconductor device and the method of manufacturing a module-type semiconductor device according to the present invention are useful for power semiconductor modules used in power converting equipment and power source devices such as those of various types of industrial machines and are particularly suitable for power semiconductor modules used in inverter systems under corrosive gas environments.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A module-type semiconductor device, comprising:
a substrate having a first main surface;
a semiconductor chip and a conductive plate mounted on the first main surface of the substrate;
a case adhered to a peripheral edge of the substrate, surrounding a periphery of the first main surface of the substrate, whereby a recess having a box-like shape is formed by the case and the substrate, the case having a plurality of inner walls that form sidewalls of the recess, the first main surface of the substrate forming a bottom of the recess, the recess housing therein the semiconductor chip and the conductive plate;
an encapsulant filling the recess to cover the semiconductor chip and the conductive plate;
a cover having second and third main surfaces opposite to each other and a plurality of side surfaces, the cover being disposed in the case with a first gap, in a range from 1 mm to 3 mm, in a direction parallel to the first main surface between the side surfaces of the cover and the inner walls of the case, the cover closing an opening of the recess with the second main surface facing the first main surface so as to form an accommodating space within the recess such that the semiconductor chip and the conductive plate are disposed in the accommodating space and the second main surface is located away from a top surface of the encapsulant;
a cover receiving part including a flat side surface that is parallel to and in contact with the inner walls of the case, and a top surface that is orthogonal to the inner walls and in direct contact with the second main surface of the cover to support the cover, the cover receiving part extending inward from the inner walls of the case into the accommodating space by a predetermined width; and
a first adhesive layer made of ambient-temperature-curing adhesive, adhering the inner walls of the case to the side surfaces of the cover, and closing the first gap, the first adhesive layer having Young's modulus in a range from 1 MPa to 50 MPa, wherein
the first adhesive layer has a first protruding portion protruding outside the accommodating space from the first gap while being in contact with the inner walls of the case and the third main surface of the cover,
the first gap and the Young's modulus of the first adhesive layer are adjusted such that a height of the first protruding portion, measured from the third main surface of the cover, is in a range from 1 mm to 2.5 mm, and the cover and the case are made from a same material, which is a polyphenylene sulfide resin (PPS).

2. The module-type semiconductor device according to claim 1, wherein the cover has, at the side surfaces thereof, a plurality of third protruding portions protruding in a direction parallel to the second main surface and in contact with the inner walls of the case.

3. The module-type semiconductor device according to claim 1, wherein the cover receiving part is disposed along an entire periphery of the inner walls of the case, and the first adhesive layer has only the first protruding portion.

4. The module-type semiconductor device according to claim 1, further comprising:

an external connection terminal, having a first end and a second end opposite to each other, the first end being exposed outside the case and the second end being electrically connected to the semiconductor chip or the conductive plate, a second gap being formed between the external connection terminal and the case; and a second adhesive layer adhering the case to the external connection terminal and closing the second gap, wherein the second adhesive layer has a fourth protruding portion protruding outward from the second gap while being in contact with the case and the external connection terminal.

5. The module-type semiconductor device according to claim 1, wherein the first protruding portion has a portion extending onto the third main surface from the side surfaces of the cover by a first width that is in a range from 1 mm to 2.5 mm.

6. The module-type semiconductor device according to claim 1, wherein the first adhesive layer contains a condensation-reaction-type silicone-based adhesive.

7. The module-type semiconductor device according to claim 1, wherein the encapsulant contains a silicone gel.

8. The module-type semiconductor device according to claim 1, wherein the first adhesive layer is away from the encapsulant.

9. The module-type semiconductor device according to claim 1, wherein the ambient-temperature-curing adhesive cures at a temperature in a range from 10 degrees C. to 50 degrees C.

10. The module-type semiconductor device according to claim 1, wherein the inner walls of the case are free of any step to support the cover.

11. The module-type semiconductor device according to claim 1, wherein a portion of each inner wall of the case that is in contact with the flat side surface of the cover receiving part is flush with a portion of the inner wall of the case that faces a corresponding one of the plurality of side surfaces of the cover.

12. The module-type semiconductor device according to claim 1, wherein the cover receiving part is provided in plurality, and each of the plurality of cover receiving parts is disposed at a corresponding one of the plurality of side surfaces of the cover.

13. The module-type semiconductor device according to claim 1, wherein the cover receiving part has a substantially rectangular shape in a cross section thereof, and a bottom surface of the cover receiving part, which is opposite to the top surface thereof, is located away from the top surface of the encapsulant.

14. A method of manufacturing a module-type semiconductor device including:

a substrate having a first main surface;

a semiconductor chip and a conductive plate mounted on the first main surface of the substrate;

a case adhered to a peripheral edge of the substrate, surrounding a periphery of the first main surface of the substrate, whereby a recess having a box-like shape is formed by the case and the substrate, the case having a plurality of inner walls that form sidewalls of the recess, the first main surface of the substrate forming a bottom of the recess, the recess housing therein the semiconductor chip and the conductive plate;

an encapsulant filling the recess to cover the semiconductor chip and the conductive plate;

a cover having second and third main surfaces opposite to each other and a plurality of side surfaces, the cover being disposed in the case with a first gap, in a range from 1 mm to 3 mm, in a direction parallel to the first main surface between the side surfaces of the cover and the inner walls of the case, the cover closing an opening of the recess with the second main surface facing the first main surface so as to form an accommodating space within the recess such that the semiconductor chip and the conductive plate are disposed in the accommodating space and the second main surface is located away from a top surface of the encapsulant;

a cover receiving part including a flat side surface that is parallel to and in contact with the inner walls of the case, and a top surface that is orthogonal to the inner walls and in direct contact with the second main surface of the cover to support the cover, the cover receiving part extending inward from the inner walls of the case into the accommodating space by a predetermined width; and a first adhesive layer made of ambient-temperature-curing adhesive, adhering the inner walls of the case to the side surfaces of the cover, and closing the first gap, the first adhesive layer having Young's modulus in a range from 1 MPa to 50 MPa, wherein the first adhesive layer has a first protruding portion protruding outside the accommodating space from the first gap while being in contact with the inner walls of the case and the third main surface of the cover, the first gap and the Young's modulus of the first adhesive layer are adjusted such that a height of the first protruding portion, measured from the third main surface of the cover, is in a range from 1 mm to 2.5 mm, and the cover and the case are made from a same material, which is a polyphenylene sulfide resin (PPS), the method comprising:

preparing the substrate;

injecting the encapsulant in the recess so as to cover the semiconductor chip and the conductive plate housed therein;

closing the opening of the recess with the cover such that the second main surface of the cover is located away from the top surface of the encapsulant so as to form the accommodating space within the recess after the semiconductor chip and the conductive plate are covered with the encapsulant; and forming the first adhesive layer adhering the inner walls of the case to the side surfaces of the cover, and closing the first gap between the case and the cover.

15. The method according to claim 14, wherein
forming the first adhesive layer includes applying the first adhesive to the first gap to embed the first adhesive in the first gap and form the first protruding portion so as to protrude from the first gap.

16. The method according to claim 15, wherein
the cover receiving part disposed facing the second main surface of the cover, along an entire periphery of the inner walls of the case, and
said closing the opening of the recess with the cover includes placing the cover on the top surface of the cover receiving part in the case to have the first gap between the case and the cover.

17. The method according to claim 15, wherein
the first adhesive is a condensation-reaction-type silicone-based adhesive, and
a viscosity of the first adhesive is in a range from 50 Pa·s to 300 Pa·s.

18. A module-type semiconductor device, comprising:
a substrate having a first main surface;
a semiconductor chip and a conductive plate mounted on the first main surface of the substrate;
a case adhered to a peripheral edge of the substrate, surrounding a periphery of the first main surface of the substrate, whereby a recess having a box-like shape is formed by the case and the substrate, the case having a plurality of inner walls that form sidewalls of the recess, the first main surface of the substrate forming a bottom of the recess, the recess housing therein the semiconductor chip and the conductive plate;
an encapsulant filling the recess to cover the semiconductor chip and the conductive plate;

a cover having second and third main surfaces opposite to each other and a plurality of side surfaces, the cover being disposed in the case with a first gap, in a range from 1 mm to 3 mm, in a direction parallel to the first main surface between the side surfaces of the cover and the inner walls of the case, the cover closing an opening of the recess with the second main surface facing the first main surface so as to form an accommodating space within the recess such that the semiconductor chip and the conductive plate are disposed in the accommodating space and the second main surface is located away from a top surface of the encapsulant; and
a first adhesive layer adhering the inner walls of the case to the side surfaces of the cover, and closing the first gap, wherein
the first adhesive layer has a first protruding portion, or a second protruding portion, or both the first protruding portion and the second protruding portion, the first protruding portion protruding outside the accommodating space from the first gap while being in contact with the inner walls of the case and the third main surface of the cover, and the second protruding portion protruding inside the accommodating space from the first gap while being in contact with the inner walls of the case and the second main surface of the cover, wherein
Young's modulus of the first adhesive layer is in a range from 1 MPa to 50 MPa,
coefficient of linear expansion of the cover and the case is in a range from $1 \times 10^{-5}$/K to $5 \times 10^{-5}$/K,
the first gap and the Young's modulus of the first adhesive layer are adjusted such that a height of the first protruding portion, measured from the third main surface of the cover, is in a range from 1 mm to 2.5 mm, and
the cover and the case are made from a same material, which is a polyphenylene sulfide resin (PPS).

* * * * *